United States Patent [19]

Somlyo et al.

[11] Patent Number: 5,410,910

[45] Date of Patent: May 2, 1995

[54] CRYOGENIC ATOMIC FORCE MICROSCOPE

[75] Inventors: Andrew P. Somlyo; Zhifeng Shao; Jianxun Mou; Jie Yang, all of Charlottesville, Va.

[73] Assignee: University of Virginia Patent Foundation, Charlottesville, Va.

[21] Appl. No.: 171,839

[22] Filed: Dec. 22, 1993

[51] Int. Cl.$^6$ .................. G01B 5/28; G01N 23/00; H01J 37/252

[52] U.S. Cl. ..................... 73/105; 250/306; 250/307

[58] Field of Search .................. 73/105; 250/306, 307, 250/423 F

[56] References Cited

U.S. PATENT DOCUMENTS

| | | | |
|---|---|---|---|
| Re. 33,387 | 10/1990 | Binnig | 250/306 |
| 4,317,036 | 2/1982 | Wang | 250/274 |
| 4,591,722 | 5/1986 | Biddlecombe et al. | 250/443.1 |
| 4,724,318 | 2/1988 | Binnig | 250/306 |
| 4,747,698 | 5/1988 | Wickramasinghe et al. | 374/6 |
| 4,800,274 | 1/1989 | Hansma et al. | 250/306 |
| 4,841,148 | 6/1989 | Lyding | 250/307 |
| 4,894,537 | 1/1990 | Blackford et al. | 250/306 |
| 4,950,900 | 8/1990 | Takeuchi et al. | 250/346 |
| 5,023,452 | 6/1991 | Purcell et al. | 250/306 |
| 5,047,637 | 9/1991 | Toda | 250/306 |
| 5,077,473 | 12/1991 | Elings et al. | 250/306 |
| 5,081,390 | 1/1992 | Elings | 310/328 |
| 5,103,095 | 4/1992 | Elings et al. | 250/306 |
| 5,106,729 | 4/1992 | Lindsay et al. | 250/307 |
| 5,144,833 | 9/1992 | Amer et al. | 73/105 |
| 5,166,615 | 11/1992 | Sidles | 324/307 |
| 5,172,002 | 12/1992 | Marshall | 250/561 |
| 5,200,616 | 4/1993 | Kokawa et al. | 250/306 |
| 5,224,376 | 7/1993 | Elings et al. | 73/105 |
| 5,260,577 | 11/1993 | Abraham et al. | 250/307 |
| 5,291,775 | 3/1994 | Gamble et al. | 250/307 |
| 5,298,748 | 3/1994 | Kenny et al. | 250/306 |

OTHER PUBLICATIONS

Mou et al–An Optical Detection Low Temperature Atomic Force Microscope at Ambient Pressure for Biological Research–Jun., 1993–(1483–1487)→ Rev. Sci. Instrum.

Primary Examiner—Richard E. Chilcot, Jr.
Assistant Examiner—George M. Dombroske
Attorney, Agent, or Firm—Sheldon H. Parker

[57] ABSTRACT

An atomic force microscope system is enclosed in a crogenic liquid dewar and operated at about ambient pressure or slightly above ambient pressure. Vaporization of the cryogenic liquid is used for cooling of the atomic force microscope system. Nitrogen, as well as other cryogenic liquids can be used, as for example helium, fluorinated hydrocarbons, isopentane, and liquid propane. Bubbling of the liquid nitrogen, which can produce excessive vibration and prevent atomic resolution for very low temperature experiments, is overcome through the pressurizing of the dewar to several psi.

22 Claims, 7 Drawing Sheets

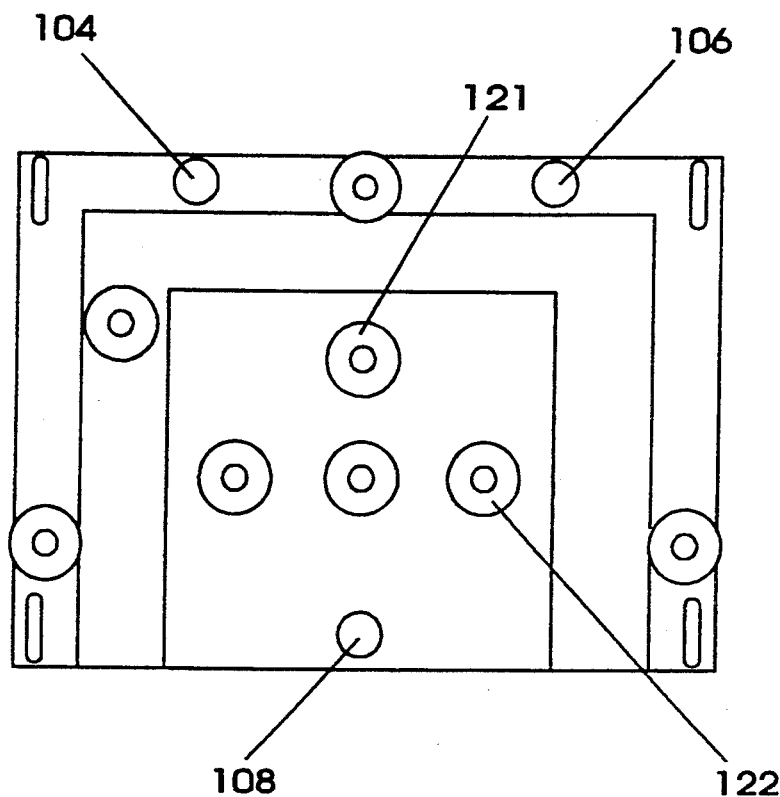
FIG. 1
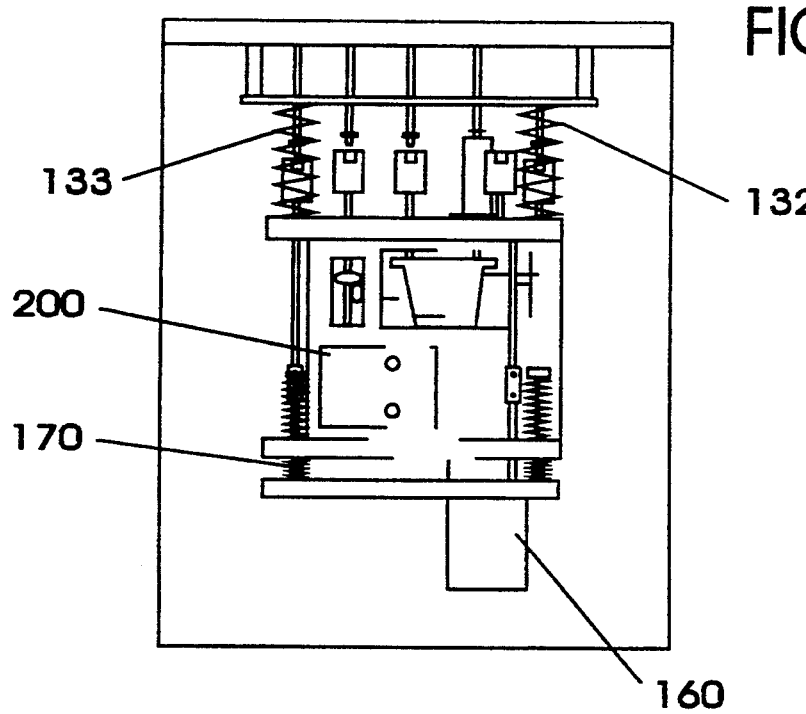
FIG. 2-B

FIG. 2-A

CRYOGENIC ATOMIC FORCE MICROSCOPE

This invention was made with Government support under Contract DAAL03-92-G-0002 awarded by the Department of the Army. The Government has certain rights in the invention.

BACKGROUND OF THE INVENTION

1. Field of the Invention

The invention relates to an atomic force microscope which is operated at cryogenic temperatures under approximately ambient pressure, and more particularly, to the surface structural determination of biological and material science specimens, using a freeze-fracture/-freeze-etch apparatus for surface structural determinations.

2. Brief Description of the Prior Art

The atomic force microscope (AFM), also called a scanning force microscope (SFM), unlike the scanning tunneling microscope, does not require the specimen to be either electron or ion conductive. Therefore, the atomic force microscope has applications in the biological sciences, as well as in the materials sciences. The high-resolution capability of the atomic force microscope is particularly attractive to researchers in structural biology, since crystallization is not required for atomic force microscope imaging.

Operating at room temperature in air, under vacuum, or in aqueous solutions, the atomic force microscope is capable of obtaining atomic resolution on hard crystalline specimens, like mica and highly oriented pyrolytic graphite. However, for soft biological specimens, the resolution is much lower, generally in the range of nanometers. The atomic force microscope has been used to obtain images of various biological specimens, such as DNA, membrane proteins, and synthetic lipid and phospholipid supported bilayers. Resolutions limited to about 4-6 nm in air and 1-2 nm in buffer solutions have been achieved on substrate supported specimens in only a few cases.

The atomic force microscope uses a sharp stylus tip mounted on the end of a soft cantilever to probe the specimen surface. The interaction force between the tip and the specimen is responsible for the image contrast. Although the operation principle of such an instrument is simple, such a direct point contact approach to obtain images is fundamentally different from all other imaging instruments, such as electron or light microscopes, X-ray diffraction, and NMR. Since the contrast is obtained exclusively by localized interactions without any averaging, it poses stringent requirements on the shape and material of the tip, the mechanical strength of the specimen, and the adhesion between the specimen and the substrate. For biological applications of the atomic force microscope, the major limitation is the softness of the specimens, which in most cases prevents achieving very high spatial resolution. Further details are found in Mou et al., *An Optical Detection Low Temperature Atomic Force Microscope at Ambient Pressure for Biological Research*, Rev. Sci. Instrum. 64 (6), June 1993. The subject matter of the article is incorporated herein by reference, as though recited in full.

Attempts to improve the atomic force microscope have centered around specimen preparation and tip manufacture. While the use of sharpened tip did not yield much improvement in the spatial resolution, the use of supported specimens provided improved resolution, but below the level which is required to resolve an alpha-helix of a protein. The use of a sharper tip requires the exertion of a larger local pressure, thereby exacerbating the problem of specimen deformation and/or damage. Severe deformation is already apparent with currently available tips at sub-nN force.

The imaging of bio-specimens at low temperature would appear to be one approach to improving the resolution of atomic force microscopes on biomacromolecul. es to the sub-nm range, since at the temperature of liquid nitrogen or similar low temperature liquid, most bio-materials showed a dramatic increase in mechanical strength (Young's modulus increased by a factor of $10^3$ to $10^4$). When combined with the modification of the well established techniques of freeze-fracture and freeze-etch, the ice matrix can also serve as a convenient solid substrate support. However, a major disadvantage of this approach is that surface contamination must be eliminated before this approach can be useful. The contamination problem is much more severe at cryogenic temperatures, because most of the contaminants will condense on the specimen surface, obscuring the features to be studied. A layer of such condensation would most likely appear as a nonuniform surface coverage due to the lack of control, and thereby prevent the imaging of specimen surface topology by the atomic force microscope.

An ultra-high vacuum (UHV) system may reduce such condensation to some extent. However, although the cryogenic pump becomes extremely efficient at 4.2 K, it would be difficult to reach the required vacuum at higher temperatures on the order of 77 K. Moreover, the maintenance of an ultra-high vacuum environment becomes more difficult and expensive, if not impossible, due to the presence of water in most preparations of biological specimens and an ice matrix as a solid substrate support because some etching will unquestionably occur. At intermediate vacuum ($10^{-6}$ torr), such as the level used in most freeze-fracture/freeze-etch apparatus for replica making in electron microscopy, it has been shown that a complete surface coverage of contaminants takes about 30 minutes. In fact, a low-vacuum, low-temperature atomic force microscope system has been reported which shows that severe surface contamination preventing atomic resolution imaging of mica, occurred even before the temperature of 150 K was reached. The disadvantage of using UHV systems in the atomic force microscopy of material science specimens is removing volatile specimen components, such as $O_2$ dopents in superconductors, by evaporation.

SUMMARY OF THE INVENTION

It is an object of the invention to provide an atomic force microscope capable of surface imaging at high spatial resolution.

It is a further object of the invention to provide an atomic force microscope capable of surface imaging soft biological specimens and material science specimens at high spatial resolution.

It is another object of the invention to provide high spatial resolution in an atomic force microscope, free from the surface contamination problems and/or removal of volatile specimen components, experienced with UHV, low temperature, systems.

It has now been found that the foregoing objects can be attained through the use of cryogenic temperatures. It has also been found that the problem of ice condensation, the main source of surface contamination and some major technical obstacles in constructing an ultra-high vacuum system for atomic force microscope imaging of biological specimens, can be overcome through the reduction of the water content in the imaging environment.

In accordance with the present invention, the atomic force microscope system is enclosed in a nitrogen dewar and operated under ambient pressure nitrogen gas from the vaporization of the liquid nitrogen. Other cryogenic liquids can be used, as for example helium, fluorinated hydrocarbons, isopentane, and liquid propane. While micronucleation, that is, bubbling of the liquid nitrogen, would be expected to prevent the atomic resolution for very low temperature experiments (close to 77 K) it has been found that this micronucleation problem can be overcome through the pressurizing of the dewar to several psi. Due to the slight increase of the melting point and the large heat capacity, the liquid nitrogen is maintained bubble-free for many hours, with only a slight temperature increase. Upon pressure relief, the liquid nitrogen will boil for a few minutes and be ready for another imaging cycle.

The instant invention deviates from the prior trends by using the combination of low temperature and ambient or slightly elevated pressure, in contrast with the prior art use of low temperature and ultra-high vacuum.

BRIEF DESCRIPTION OF THE DRAWINGS

FIG. 1 is a top view of the atomic force microscope head, showing adjustment connections;

FIG. 2-B is schematic illustration of the atomic force microscope, including the top flange, shown rotated orthogonally;

DESCRIPTION OF THE PREFERRED EMBODIMENTS

Atomic force microscopes are known in the art, as described in U.S. Pat. No. 5,144,833, issued to Amer et al, and U.S. Pat. No. 4,724,318, issued to Binning, the disclosures of which are incorporated herein by reference, as though recited in full. The operation of the microscope and, in particular, the operation of the resilient cantilever for holding the tip, are discussed in U.S. Pat. No. 5,200,616, the disclosure of which is incorporated herein by reference, as though recited in full.

The use of cryogenic temperatures in vacuum based systems has failed to achieve the desired improvement of the resolution of atomic force microscopes with biological specimens, due to the condensation of contaminants and evaporation of volatile specimen components that occurs during operation.. Further, the use of the vaporization of a liquid refrigerant such as nitrogen would fail to produce the desired results due to the vibration caused by micronucleation. The invention deviates from the prior trends by using the combination of nitrogen or helium vapor at a low temperature and at ambient or slightly above ambient pressure, in contrast with the prior art use of low temperature and ultra-high vacuum. A major innovation is the utilization of a vapor at about ambient pressure and cryogenic temperatures. The contamination problem is further controlled through the use of baffles. The baffles ensure minimal diffusion of water molecules and other contaminants into the imaging chamber from the outside. It has been established by testing, that when operating continuously for up to 15 hours with the temperature at about 79° K, atomic resolution images of both mica and graphite were obtained, indicating negligible surface contamination.

The equivalent vacuum for water molecules of less than $10^{-14}$ tort which can be attained is sufficient for long periods of atomic force microscope imaging without serious ice condensation. The resultant system can be applied to biological applications, as well as material sciences, where the use of temperatures several degrees above the liquid nitrogen temperature of 77 K at ambient pressure is not a problem. The system of the instant invention has particular utility in the study of high Tc superconductors, which lose oxygen in a vacuum, at a high rate, and consequently, the use of ambient pressure is advantageous.

Figure 2:
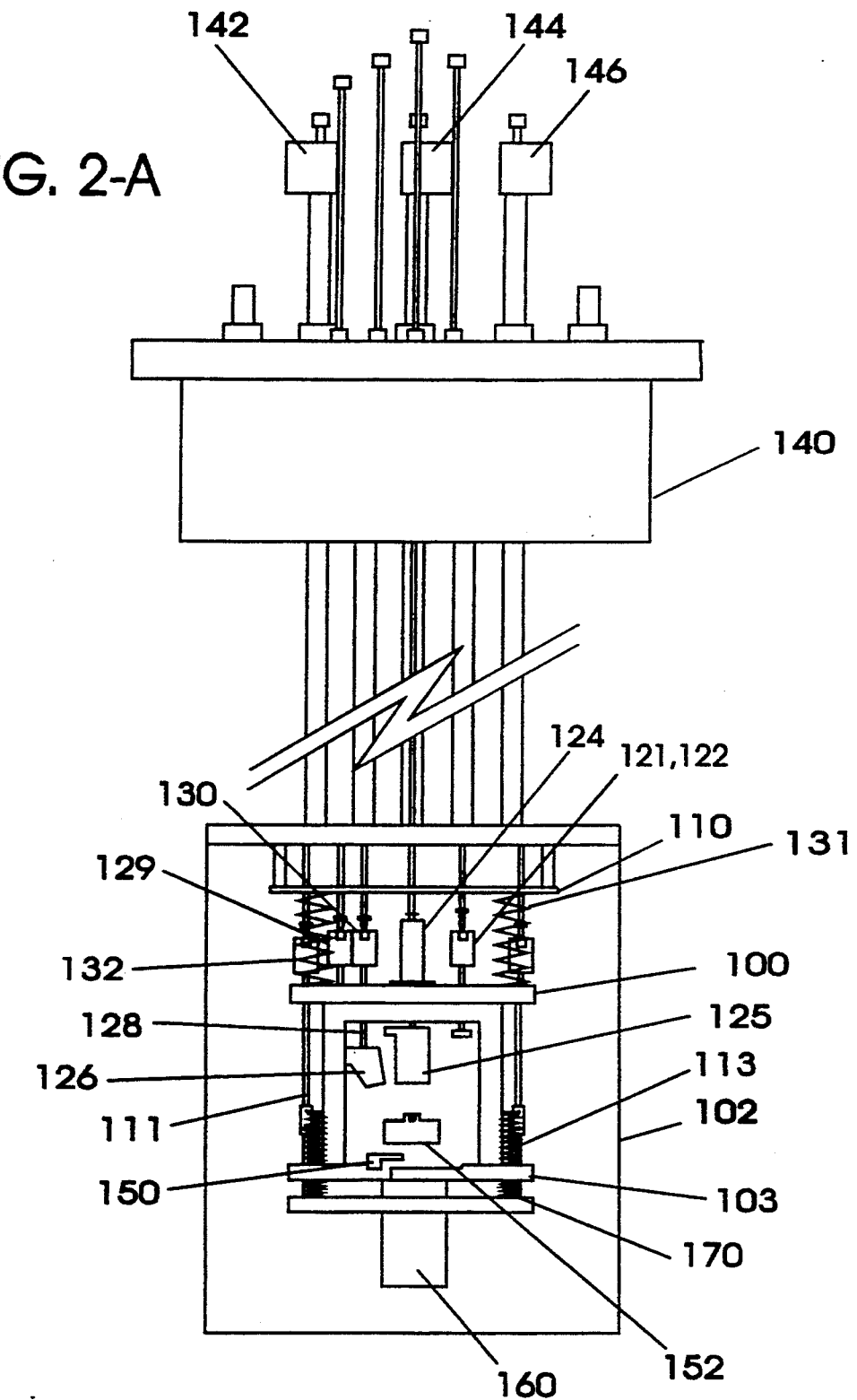
FIG. 2-A is schematic illustration of the atomic force microscope, including the top flange.

The AFM head as illustrated in FIGS. 1, 2-A, and 2-B has a compact metal flange 100, to increase system rigidity. It is enclosed in a metal chamber 102 for better temperature control and stability. Initial engagement screws 111, 112 (not visible) and 113 can be remotely adjusted via stepping motors. Position posts 104, 106 and 108 lock the AFM head to the upper flange 110 when adjustment or specimen exchange is needed. The laser diode assembly 125 is made of copper to facilitate heat dissipation. A single glass lens is used to focus the laser beam onto the cantilever. Adjustment screws 121 and 122 serve to tilt the laser beam direction around the head locker unit 124 at which the laser emission is centered. A 2- or 4-element photodetector 126 is housed in a metal frame, which is fixed on a pivot point 128. The horizontal position adjustment screw 129 is for adjusting the photodetector 126 and the adjustment screw 130 is used to push the detector to rotate around the pivot point 128. Four springs, 131, 132 and 133 (the fourth of which is not visible in the figures) are used to suspend the AFM head from upper flange 110, in order to isolate the mechanical coupling. Three very strong magnets of several mega-Gauss strength are attached to the atomic force microscope base to provide efficient magnetic damping of mechanical disturbances. This simple vibration isolation allows the dewar to be placed directly on the floor for atomic resolution imaging. The head locker unit 124 contains a thick wall metal cylinder with a tapped hole, so that when the long shaft from the top of the chamber is lowered and screwed to the cylinder, the head can be pulled up from the top to lock into the fixed position with respect to the upper flange 110.

The baffle assembly 140 for the AFM dewar provides for a tortuous gas flow path, thereby serving to trap contaminants. The baffles are preferably made of about four or five metal plates, about five inches apart. Each plate can be a cold trap to contaminants, with each lower plates being progressively more effective due to the progressively lower temperature. The assembly is preferably just below the top flange. The space between the metal plates can be filled with a porous material, such as styrofoam, in order to improve the performance of the assembly. The purpose of the baffle assembly is to dramatically restrict the flow of any gaseous contaminant from diffussing through the top flange, or through a relief valve at the top, and reaching the inside of the dewar. Since the pressure relief valve is open to the atmosphere, it is possible for contaminants to migrate against the flow of the vented cryogenic gas. Additionally, the baffle reduces the thermal gradient inside of the dewar.

The quick-disconnect joints provide liquid nitrogen transfer, pressure relief, and pressure build-up (up to about 5 psi). The driver boxes 142, 144 and 146 provide for automatic control of initial engagement by stepper motors. The cantilever holder 150 is simply attached by a self guiding magnet, which allows the exchange of the tip in situ as explained below. The mirror 152 allows for visualization of the cantilever tip by the operator, and is especially useful for initial laser beam adjustment. The piezo scanner 160 is mounted in a metal cylinder by an adhesive, such as an epoxy. The piezo scanner 160 is attached to the AFM head base 103 by four strong springs 170, to support the AFM head and provide vibration isolation. The lengthening of the springs allows the piezo scanner to be pushed 0.75 inch down for specimen exchange. The preamplifier 200, for the photodetector 126 is mounted at the side of the head frame. The AFM chamber has a side door which opens and closes by sliding up and down, facilitating in situ loading (and unloading) of specimens for imaging. For successful low-temperature AFM imaging, the standard metal coating on the back of the cantilever is removed to prevent differential thermal shrinkage that causes the bending of the cantilever when the temperature is lowered. In extreme cases, this bending could become so severe that lowering the temperature by 80 degrees could deflect the laser beam out of the range of the detector.

Figure 3:
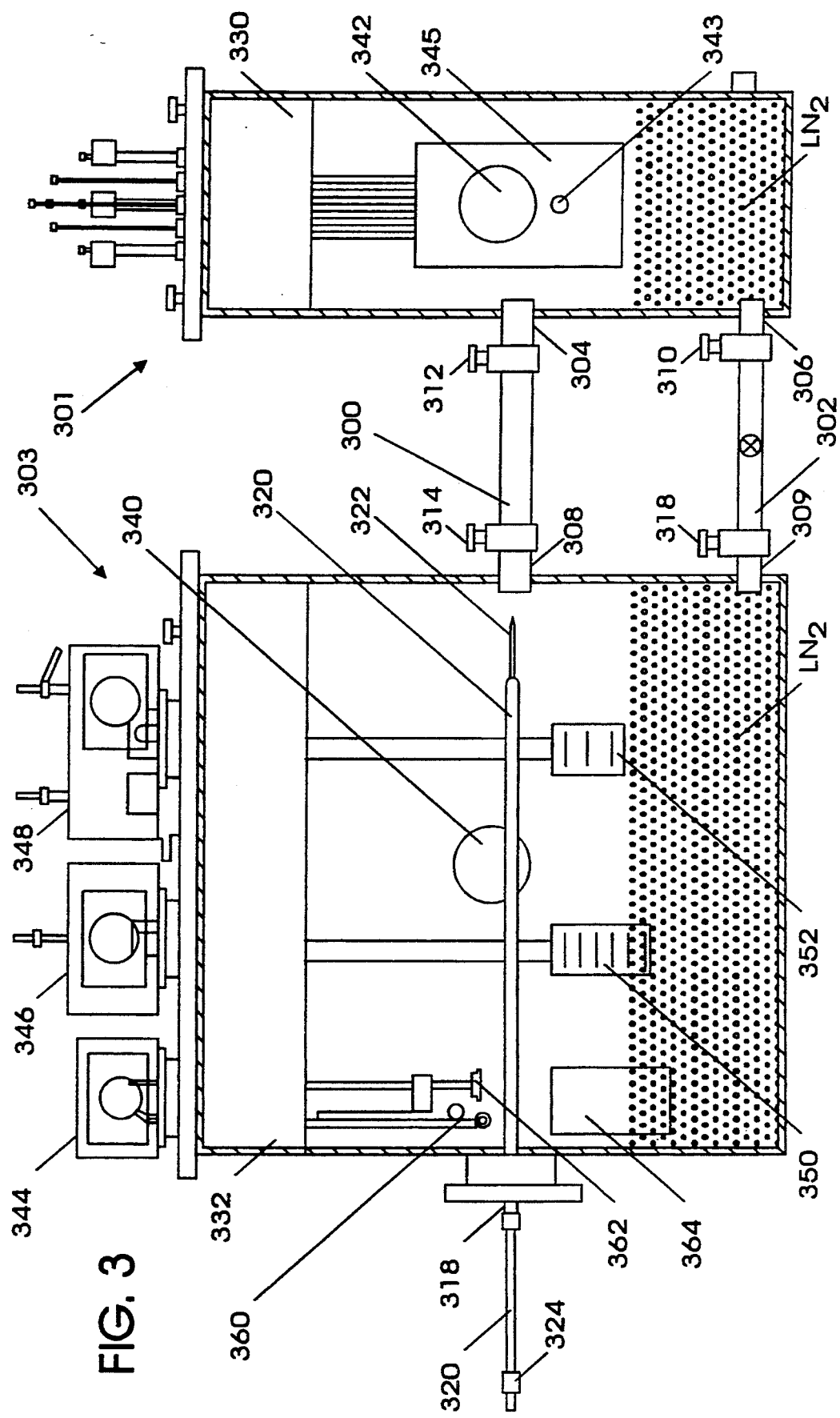
FIG. 3 is a schematic illustration of a low temperature atomic force microscope, showing the specimen handling system.

There are two approaches to the system design according to temperature control: passive and active. The passive low-temperature AFM system is depicted in FIG. 3. The two dewars, the AFM dewar 301 and the specimen manipulation dewar 303, are super-insulated to ensure minimal liquid nitrogen consumption and temperature stability. Two super-insulated tubes 300 and 302 are provided for back-and-forth specimen transfer and liquid nitrogen transfer between the two dewars 301 and 303, connecting the port openings 304-308 and 309-306, respectively. The two port openings 304 and 306 are in the side of the AFM dewar 301 and provide access for specimen and liquid nitrogen transfer, respectively. The port openings 308 and 309 are the corresponding openings in the specimen manipulation dewar 303. The gate valves 310 and 312, as well as 314 and 316, are super-insulated to prevent additional heat loss. The port opening 318 disposed opposite the port opening 308 is provided with multiple O-ring seals to allow a stainless steel double-wall shaft 320 to move back and forth and to rotate during specimen transfer. The inside space between the double wall of the shaft 320 is evacuated to improve the thermal insulation. Inside the shaft 320 is another thin-wall stainless steel tube 322 that can move freely with specimen grabbing apparatus at the inner side of the shaft 320 to grab specimens. The other end of the tube 322 is sealed at 324 by multiple rubber O-rings to reduce heat loss. The baffle assemblies 330 and 332 for the two dewars, are carefully designed to trap all contaminants from reaching the inside of the dewars. Purified liquid nitrogen is first transferred to the specimen manipulation dewar. After settling down, the liquid nitrogen can be transferred to the AFM dewar 301 by gravity flow or it can be assisted by pressurization. Such a slow transfer prevents any contaminants that settled in the specimen manipulation dewar 303 from reaching the AFM dewar 301, providing an additional safeguard against contamination. Two opposing windows are mounted at the level of specimen transfer port openings for the two dewars, respectively, 340 for the specimen manipulation dewar 303, and 342 for the AFM dewar 301, to facilitate visual guidance during specimen transfer between various places in the system. An access port 343 is disposed below the window 342. An AFM chamber 345, which is described in greater detail below, is disposed within the AFM dewar 301.

Three glove boxes at the top flange of the specimen manipulation dewar are necessary for room temperature specimen and tip manipulations. Each has a separate evacuation port to allow its interior to be purged, thereby preventing room temperature operations such as specimen and tip mounting from introducing additional contamination into the system. Glove box 344 is for the freeze-fracture/freeze-etch apparatus, glove box 346 is for the specimen storage chamber 350, and glove box 348 is for the tip storage chamber 352.

The freeze-fracture/freeze-etch apparatus consists of a knife shaft 360 and a specimen platform shaft 362. The knife moves vertically to fracture specimens mounted at an appropriate place on the specimen platform. The specimen position with respect to the knife is adjusted by a stepping-motor driven gear box for precision. The specimen platform has an electric heater for facilitating the freeze-etch process. Unlike conventional freeze-fracture/freeze-etch procedures, this process preferably involves the freeze fracturing of the biological specimen followed by its direct use.

The inside space of the specimen manipulation dewar 303 is sufficiently large to allow a container 364 to be filled with a different cryo-agent, which can be cooled by liquid nitrogen and provides more efficient fast freezing than liquid nitrogen. Such cryo-agents include helium, freon, liquid propane, isopentane, methanol and the like. The freezing of the specimen for the freeze-fracture step can be facilitated through the use of a heat exchange material such as saphire or gold plated polished copper. The specimen storage chamber 350 contains a multi-shelf apparatus that can store frozen specimens, whether prepared or nonprepared. The tip storage chamber 352 is used to store tips. The system is designed to provide in situ specimen exchange and tip exchange at low temperatures. All specimen movements are achieved by the positioning shaft 320, by positioning the various parts, 362, 350, 352, etc., to the level of the shaft 320.

Tip exchange is performed by the following procedure: a number of cantilever holders with preloaded tips are stored in the tip storage container 352. The shaft 320 can disengage the cantilever holder from the AFM head, and install another one from the storage. All used cantilever holders are then taken out of the dewar to be refitted.

After the specimen is loaded, and the system is adjusted, the imaging temperature is adjusted by moving the position of the AFM chamber in the AFM dewar 301. This allows the temperature to be adjusted in the range from 79 K to 85 K when the liquid nitrogen level is several inches below the observation window. For higher temperatures, the liquid nitrogen level must be lowered. Using this approach, the temperature stability can be maintained within 0.1 K/min, which is sufficient for atomic resolution imaging.

Figure 4:
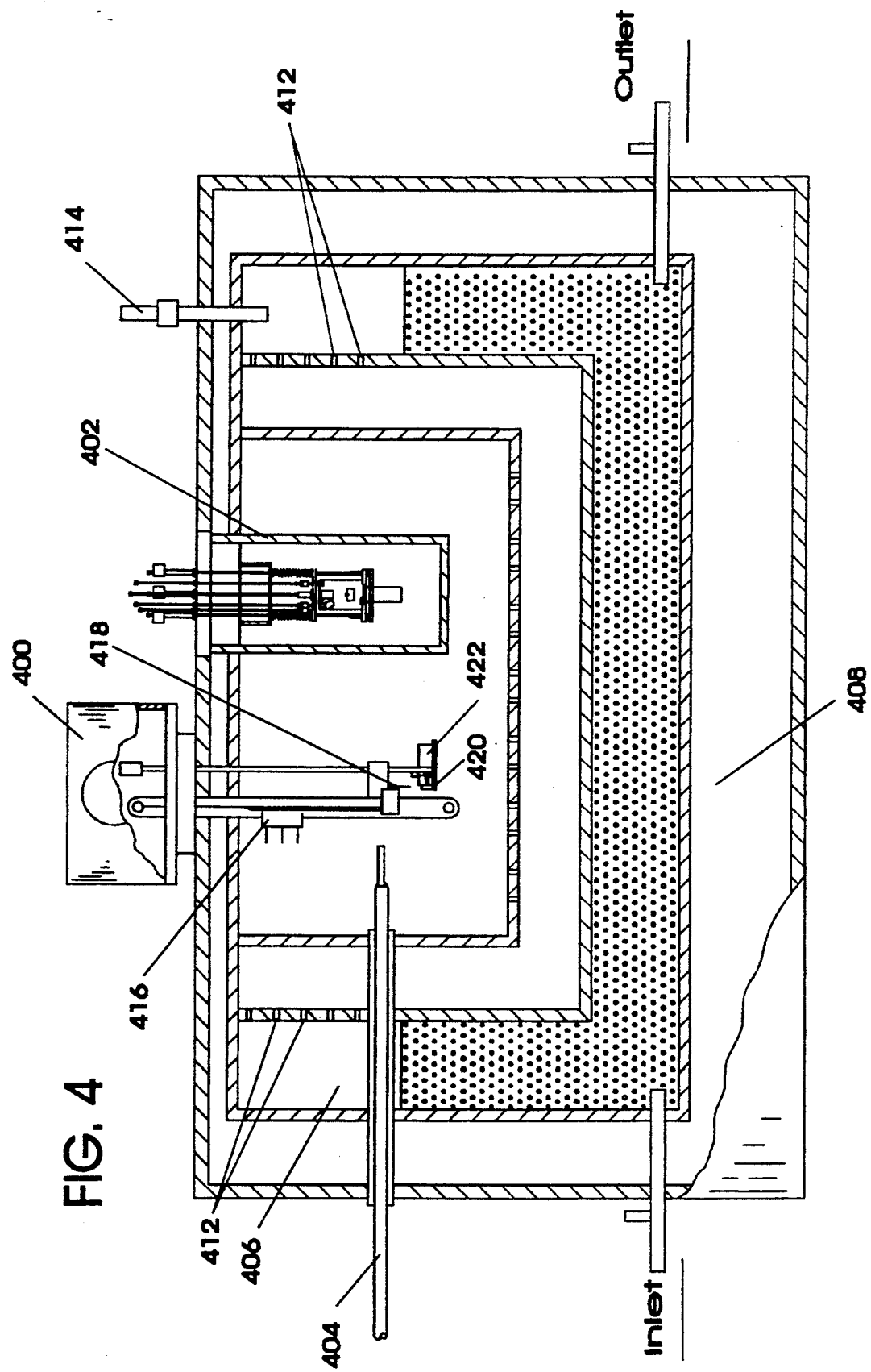
FIG. 4 is a schematic illustration of a compact low temperature atomic force microscope system.

FIG. 4 shows a compact low-temperature AFM system with active temperature control. The size of the complete instrument can be similar to that of a cryomicrotome, roughly 2×2×2 feet. The operation is similar to the one presented in the system of FIG. 3. The contamination condensation can be prevented through outside environmental control, such as a clean room or a large glove box. The system consists primarily of an AFM head assembly and a freeze-fracture/freeze-etch apparatus. The glove box 400 is used for specimen loading and the operation of the freeze-fracture/freeze-etch apparatus. The chamber 402 is provided for the AFM head and contains a sliding door to facilitate specimen exchange. The specimen transfer shaft assembly 404 is used to transfer specimens. Liquid nitrogen can be constantly pumped into the space 406, and the temperature is controlled by adjusting the flow rate in combination with the operation of an electric heater. The wall of the chamber 408 is made of metal and provided with several holes 412 in the side-walls above the liquid level, to provide more efficient cooling by cold nitrogen gas. Inlet and outlets are provided for liquid nitrogen circulation. A pressure relief valve 414 is provided for system safety. A block 416 contains heaters for freeze-etch. A fracture knife 418 is mounted on a block. The block 416 and the fracture knife 418 are attached to a metallic chain so that they can be manipulated around the sample 420. The specimen 420 is mounted on a specimen holder. A block 422 contains stepping motor gear box to drive the movement of the specimen 420.

Figure 5:
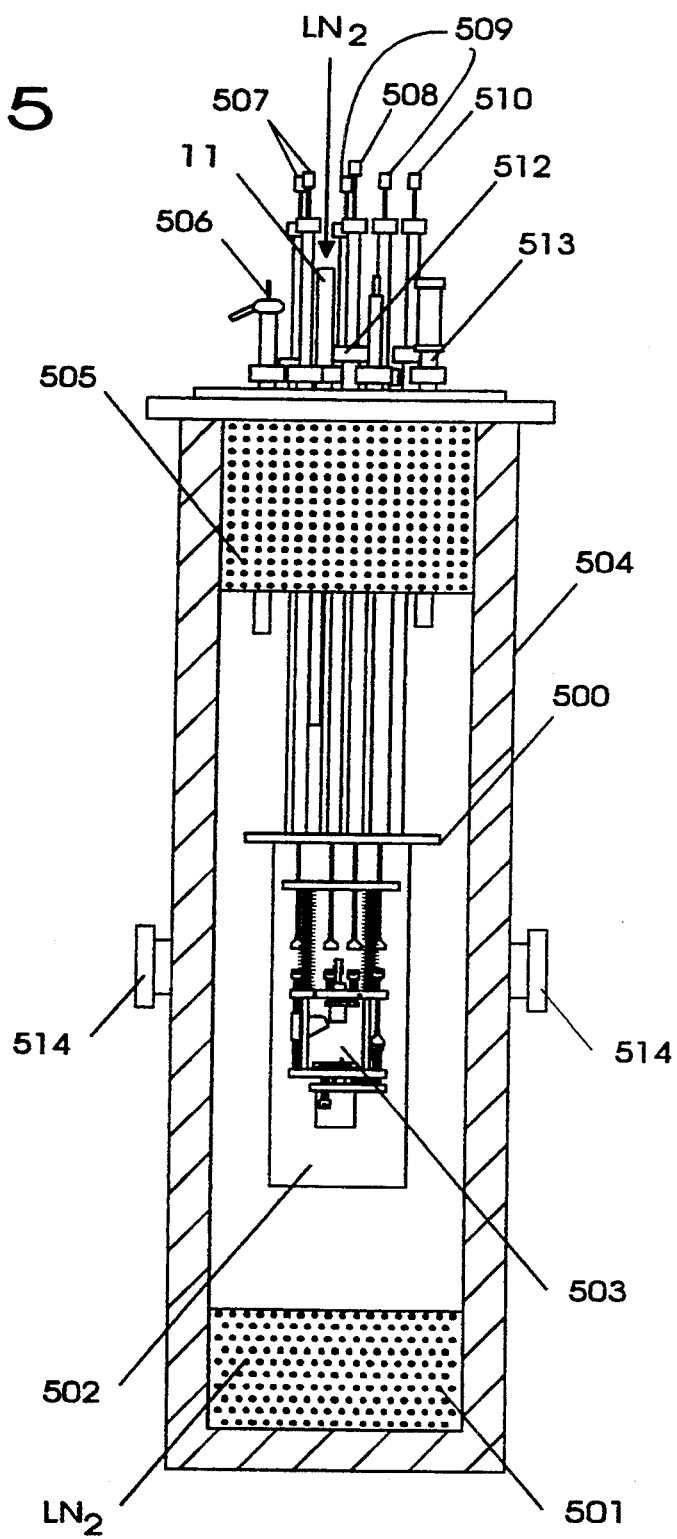
FIG. 5 is a schematic illustration of an atomic force microscope dewar.

FIG. 5 illustrates an alternate embodiment of the ambient pressure low temperature AFM of the present invention. Liquid nitrogen 501 is contained within a liquid nitrogen dewar 504. A pair of view ports 5 14 allow viewing the contents of the liquid nitrogen dewar 504. Within the liquid nitrogen dewar 504, an AFM chamber 502 is disposed above the liquid nitrogen 501. An AFM head 503, as described in greater detail below, is disposed within the AFM chamber 502. A baffle assembly 505 is disposed within and near the top of the liquid nitrogen dewar 504. A quick relief valve 506, a pair of photodiode adjustments 507, a AFM head locking shaft 508, a pair of laser diode tilt adjustments 509, an initial approach control 510, a liquid nitrogen transfer port 511, an electrical feed through 512, and a pressure relief valve 513, are all disposed on top of, and pass through, the liquid nitrogen dewar 504. These elements correspond to those described in greater detail above and below.

Figure 6:
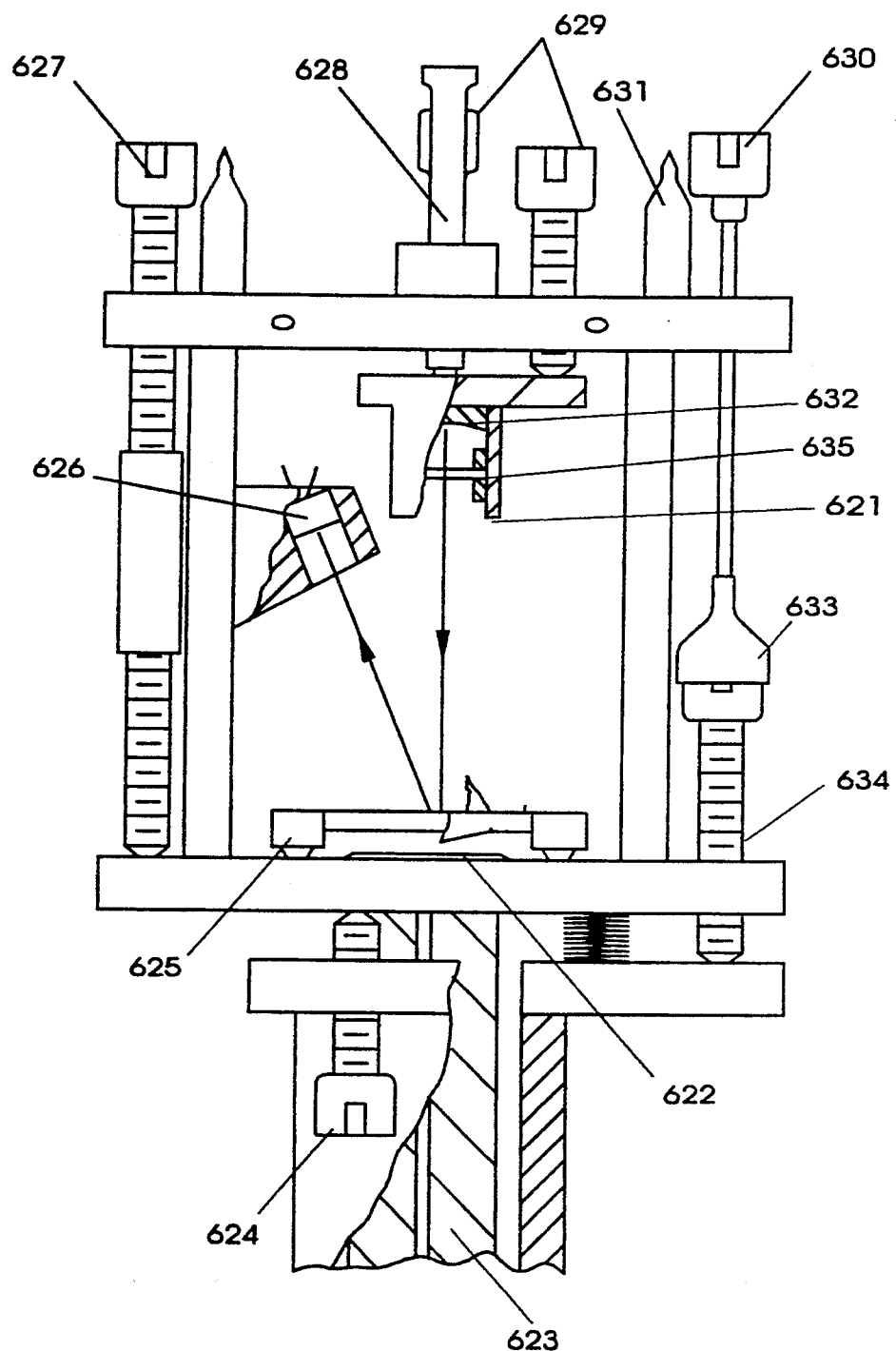
FIG. 6 is an enlarged schematic illustration of the atomic force microscope head of FIG. 5.

FIG. 6 illustrates a detailed view of an alternate embodiment of the AFM head of the present invention. A pair of alignment posts 631 guides the movement of the metal flange 500 relative to the AFM head body frame 503. A pair of coarse adjustment screws 624 permits adjusting the relative distance between the piezo tube assembly 623 and the AFM head base 503. Additional adjustment means are provided by initial approach adjustment 630 in conjunction with initial approach screw 634. After adjustment is completed, an AFM head lock secures the entire assembly once adjustment is completed. A cantilever holder 625 is attached to the base of the AFM head body frame 503. A sample holder 622, which is also attached to the AFM base 103, is disposed in operative relation with the cantilever holder 625. A piezotube 624 is disposed below the sample holder 622 and the cantilever holder 625. A laser diode assembly 621, which is attached to the body frame 503 by a pair of laser diode tilt adjustment screws 629, is disposed vertically above the sample holder 622 and the cantilever holder 625. A focus lens 635 is disposed within the laser diode assembly 621. Signals from a laser diode 632 disposed within the laser diode assembly 621 travel vertically downward toward the sample holder 622 and the cantilever holder 625 and then are projected for detection by a photodiode 626. The photodiode 626 is disposed to travel in the vertical direction along a photodiode position screw 627.

Figure 7:
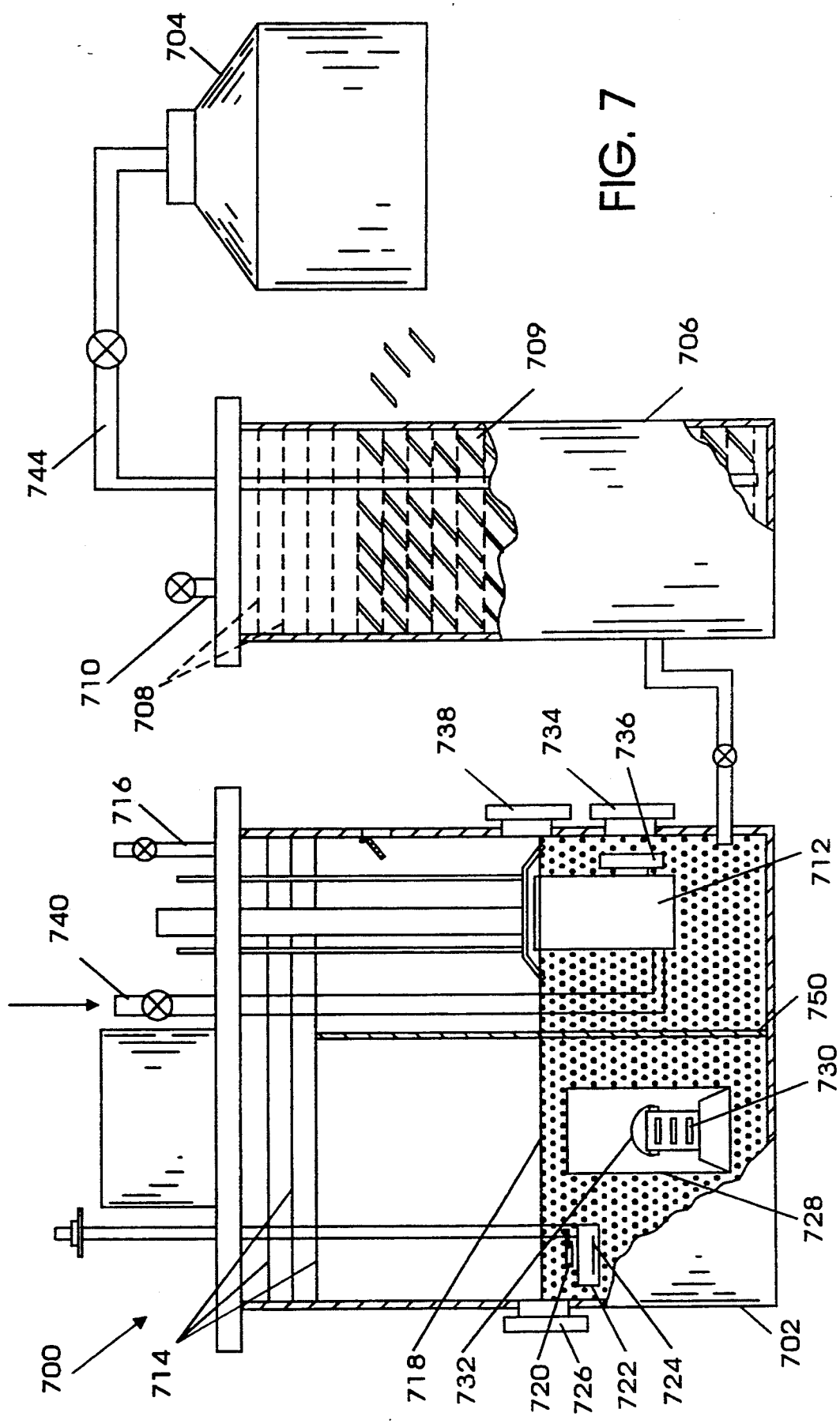
FIG. 7 is a schematic illustration of an alternate embodiment of a assembly in which the a filtering system is provided for the liquid nitrogen.

In the system 700, of FIG. 7, the cryogenic liquid is filtered so that the liquid fed to the Atomic force microscope dewar 702 is free of contaminants. A liquid nitrogen reservoir 704 is provided with a heater pump, not shown, for delivering liquid nitrogen to a buffer dewar 706, via a liquid nitrogen transfer tube 744. The buffer dewar 706 has a plurality of baffle plates, which can be of the design previously described. The baffle plates serve to preclude contaminants from migrating through the relief valve 710, to the atomic force microscope chamber 712. In addition to baffle plates, filters 709 are provided to further prevent the migration of contaminants through the relief valve 710, to the atomic force microscope chamber 712. The filter media can be styrofoam, or other vapor permeable media.

The upper region of the atomic force microscope dewar 702 is provided with baffles 714, as previously described for preventing contaminants from migrating into the system through the pressure relief and main dewar flushing outlet 716. The flushing of the atomic force microscope chamber is achieved through the atomic force microscope chamber flushing outlet 740.

In the system of FIG. 7, the freeze-fracture assembly is within the atomic force microscope dewar 702. The freeze-fracture assembly, as well as the specimen storage cage 728 and the atomic force microscope chamber 712, can be maintained below the liquid nitrogen level 718. The freeze-fracture assembly includes a specimen preparation table 722, a knife 720 and a heater 724. Prepared specimens 730, can be stored in the specimen storage cage 728. An anti-contamination cap 732 is employed to protect the stored specimens against contamination. The freeze-fracture step can be viewed through the sight glass 726. Similarly, the operation of the atomic force microscope can be viewed through the pair of sight glasses 734 and 736. A buffer plate 750 can be provided between the dewar section which houses the atomic force microscope and the specimen processing and storage section. The liquid nitrogen level can be viewed through the sight glass 738. Manipulation of the various elements, such as the fracture knife 720, and the control of the elevation of the various units, such as the freeze-fracture assembly, is achieved as described in relation to the devices of the previous figures.

What is claimed is:

1. A low temperature atomic force microscope comprising, a thermally insulated low temperature chamber, a cryogenic gas within said chamber, said atomic force microscope having a head, said head being within said chamber and in thermal contact with said cryogenic gas, said chamber being at least about ambient pressure.

2. The atomic force microscope of claim 1, wherein said low temperature chamber further includes cryogenic liquid and said head includes a probe for tracing the surface of a sample, wherein said probe is cooled by the vapor of said cryogenic liquid.

3. The atomic force microscope of claim 2, wherein said head includes a probe for tracing the surface of a sample, and wherein said head is positioned in thermal contact with said cryogenic liquid, said sample is within said cryogenic gas and said chamber is at a pressure in the range from 1 to 5 psi above ambient pressure, whereby bubbling of said cryogenic liquid is precluded.

4. The atomic force microscope of claim 1, wherein said cryogenic gas is helium.

5. The atomic force microscope of claim 4, wherein said chamber is at a pressure in the range from 1 to 5 psi above ambient pressure.

6. The atomic force microscope of claim 1, wherein said cryogenic gas is nitrogen.

7. The atomic force microscope of claim 6, wherein said chamber is at a pressure in the range from 1 to 5 psi above ambient pressure and at a temperature above 77 K.

8. The atomic force microscope of claim 1, further comprising a baffle assembly mounted in said low temperature chamber between said cryogenic gas and the ambient temperature exterior of said chamber, said baffle assembly providing a tortuous path for contaminants migrating from said chamber exterior to the interior of said chamber, whereby the condensation of solidifiable gases onto the atomic force microscope imaging unit is controlled by limiting diffusion of contaminants into the chamber from the room temperature exterior of said chamber.

9. The method of generating topographs of the surface of a sample, using an atomic force microscope, comprising cooling the region of the head of the atomic force microscope by vaporization of a cryogenic liquid at a pressure about ambient pressure.

10. The method of claim 9, wherein said head includes a probe for tracing the surface of a sample, and wherein said probe is cooled by the vapors of said cryogenic liquid.

11. The method of claim 10, further comprising the step of freeze fracturing a biological specimen to produce said sample, maintaining said sample in thermal contact with said cryogenic vapors and tracing the surface of said sample.

12. The method of claim 11, wherein said step of freeze fracturing said biological sample is carried out in a cryogenic fluid and said freeze fractured sample is cooled by said vapors until the completion of the tracing of said surface of said sample by said atomic force microscope.

13. The method of claim 9, wherein said head includes a probe for tracing the surface of a sample, and wherein said probe is cooled by being positioned in thermal contact with said cryogenic liquid and said sample is in thermal contact with said vapors.

14. The method of claim 13, wherein said chamber is at sufficient pressure to preclude bubbling of said cryogenic liquid.

15. The method of claim 9, wherein said cryogenic liquid is helium.

16. The method of claim 9 wherein said cryogenic liquid is nitrogen.

17. The method of claim 16, wherein said chamber is at a sufficient pressure to preclude bubbling of said cryogenic liquid, and at a temperature above 77 K.

18. The method of claim 9, further comprising the step of precluding the flow of contaminants from the exterior of said atomic force microscope to the sample by causing contaminants to flow through a tortuous path from the exterior of said atomic force microscope to said sample and causing said contaminants to deposit on a solid surface within said path.

19. A low temperature atomic force microscope comprising, a thermally insulated low temperature chamber, the vapor of a cryogenic liquid within said chamber, said atomic force microscope having a scanning assembly, said scanning assembly being within said chamber and in thermal contact with said cryogenic vapors, said chamber being at, at least about ambient pressure, said scanning assembly being suspended by a plurality of springs, whereby during imaging the scanning assembly of the system is mechanically isolated from vibrations.

20. The atomic force microscope of claim 19, further comprising filtering means, said filtering means filtering cryogenic liquid, delivery means, said delivery means delivering filtered cyrogenic fluid to said chamber, thereby eliminating contaminants in said cryogenic liquid.

21. The atomic force microscope of claim 20, said scanning assembly further comprising a cantilever tip, said cantilever being free from a metal coating, thereby eliminating differential thermal shrinkage.

22. The atomic force microscope of claim 21, said scanning assembly further comprising temperature control means, said temperature control including means for varying the position of said scanning assembly relative to said cryogenic liquid.

* * * * *